(12) United States Patent
Li et al.

(10) Patent No.: US 11,315,915 B2
(45) Date of Patent: Apr. 26, 2022

(54) DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Zhonghua Li, Beijing (CN); Shipeng Wang, Beijing (CN); Jian Sang, Beijing (CN); Shaofei Guo, Beijing (CN); Dongjia Hao, Beijing (CN); Chunying Qiao, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 16/963,317

(22) PCT Filed: Apr. 30, 2019

(86) PCT No.: PCT/CN2019/085153
§ 371 (c)(1),
(2) Date: Jul. 20, 2020

(87) PCT Pub. No.: WO2020/220250
PCT Pub. Date: Nov. 5, 2020

(65) Prior Publication Data
US 2021/0366890 A1    Nov. 25, 2021

(51) Int. Cl.
*H04N 5/225* (2006.01)
*H01L 25/18* (2006.01)
*H01L 27/12* (2006.01)

(52) U.S. Cl.
CPC .......... *H01L 25/18* (2013.01); *H01L 27/124* (2013.01); *H04N 5/2253* (2013.01);
(Continued)

(58) Field of Classification Search
CPC ... H01L 25/18; H01L 27/124; H01L 27/1218; H01L 27/32; H04N 5/2253;
(Continued)

(56) References Cited

U.S. PATENT DOCUMENTS

2011/0096223 A1*  4/2011  Fu .................... H01L 27/14618
                                                                  348/374
2015/0062422 A1*  3/2015  Stern ................. H04N 5/36961
                                                                  348/374
(Continued)

FOREIGN PATENT DOCUMENTS

CN    103744254 A    4/2014
CN    207352317 U    5/2018
(Continued)

OTHER PUBLICATIONS

PCT International Search Report, Application No. PCT/CN2019/085153, dated Jan. 23, 2020, 7 pages: with English translation.
(Continued)

*Primary Examiner* — Mekonnen D Dagnew
(74) *Attorney, Agent, or Firm* — Armstrong Teasdale LLP

(57) ABSTRACT

The disclosure relates to a display device, which includes a cover plate, a backlight unit, a display module disposed between the backlight unit and the cover plate, the display module including a first substrate close to the light exiting side of the backlight unit and a second substrate close to the cover plate, and a camera module arranged on the first substrate, the camera module including an infrared cut-off filter, wherein the first substrate extends horizontally beyond the second substrate and the backlight unit to form a
(Continued)

mounting section for the camera module, and the infrared cut-off filter is arranged in the mounting section.

16 Claims, 4 Drawing Sheets

(52) U.S. Cl.
CPC ......... *H04N 5/2254* (2013.01); *H04N 5/2257* (2013.01); *H01L 27/1218* (2013.01)

(58) Field of Classification Search
CPC .... H04N 5/2254; H04N 5/2257; H04N 5/225; G02B 7/04; G02F 1/1333
See application file for complete search history.

(56) References Cited

U.S. PATENT DOCUMENTS

2018/0367716 A1* 12/2018 Dobashi ............ H01L 27/14625
2019/0049703 A1    2/2019 Hu et al.
2020/0089355 A1*  3/2020 Moon .................... G06F 3/044

FOREIGN PATENT DOCUMENTS

| CN | 108196388 A | 6/2018 |
| CN | 207782959 U | 8/2018 |
| CN | 108881543 A | 11/2018 |

OTHER PUBLICATIONS

PCT Written Opinion, Application No. PCT/CN2019/085153, dated Jan. 23, 2020, 6 pages.: with English translation of relevant part.

\* cited by examiner

DISPLAY DEVICE

CROSS REFERENCE TO RELATED APPLICATIONS

This patent application is a National Stage Entry of PCT/CN2019/085153 filed on Apr. 30, 2019, the disclosure of which is incorporated by reference herein in its entirety as part of the present application.

BACKGROUND

The present disclosure relates generally to the field of display technology, in particular to a display device with reduced thickness and effectively increased screen-to-body ratio.

With the continuous development of electronic information technology, display devices, such as smart phones and tablet computers, are widely used and play an indispensable role in people's work and life.

With the increasing popularity of display devices, ultra-narrow bezel, thinning and full screen of the display devices have become the mainstream trend. As the traditional camera exists as an independent unit in the device, it occupies a large space, which is not conducive to ultra-thinning and full screen. FIGS. 1A and 1B show conventional camera structures of zoom type and fixed focus type, respectively, which include a camera module and a (mobile phone) middle case 1' for fixing the camera module, a flexible printed circuit board 3' for wiring the sensor 2', and a bracket 6' for supporting an infrared cut-off filtering sheet 4' and a lens 5' and arranged above the flexible printed circuit board. Because of the existence of the flexible printed circuit board, the (mobile phone) middle case and the bracket, the camera module, as an independent unit, has greatly hindered the trend of thinning and full screen of display devices such as mobile phones.

BRIEF DESCRIPTION

Embodiments of the present disclosure provide an improved camera module configuration, which effectively utilizes the Z-direction space in the display module structure, thus reducing the overall thickness of the display device and substantially increasing the screen-to-body ratio.

Therefore, the present disclosure provides a display device, which includes a cover plate, a backlight unit, a display module disposed between the backlight unit and the cover plate, the display module includes a first substrate close to the light exiting side of the backlight unit and a second substrate close to the cover plate, and a camera module arranged on the first substrate, the camera module includes an infrared cut-off filter, wherein the first substrate extends horizontally beyond the second substrate and the backlight unit to form a mounting section for the camera module, and the infrared cut-off filter is arranged in the mounting section.

In an aspect, the camera module may further include a lens for collecting light and a sensor for receiving light from the lens and forming sensing information, and the infrared cut-off filter may be located between the lens and the sensor.

In an aspect, the infrared cut-off filter may be configured as an infrared cut-off filtering film coated on the first substrate at the mounting section. The first substrate includes a first side facing the cover plate and an opposite second side facing the backlight unit, and the infrared cut-off filtering film may be coated on the second side and/or the first side of the first substrate. Herein, the infrared cut-off filtering film may be either a reflective infrared cut-off filtering film such as a metal or metal alloy material film, or an absorptive infrared cut-off filtering film such as a blue glass film.

According to an example aspect, at the mounting section, the sensor may be arranged on the first side of the first substrate, and the lens may be arranged on the second side of the first substrate. In this case, the lens may be a rear dual lens.

In an aspect, at the mounting section, the lens may be arranged on the first side of the first substrate, and the sensor may be arranged on the second side of the first substrate. In this case, the lens may be a front dual lens.

In an aspect, the mounting section is provided with an opening, and the infrared cut-off filter is configured as an infrared cut-off filtering sheet embedded in the opening, wherein the lens may be arranged on the second side of the first substrate at the mounting section, and the sensor is arranged on the infrared cut-off filtering sheet. Here, the infrared cut-off filtering sheet is an optical filtering sheet that allows visible light to pass through and cuts off or reflects infrared light.

In an aspect, the display device includes an integrated circuit disposed on the first side of the first substrate, and the integrated circuit is electrically connected to the sensor through a trace to drive the sensor. For example, the trace may be an indium tin oxide trace. It should be understood by those skilled in the art that traces made of other suitable materials can be used instead of the indium tin oxide traces.

In an aspect, the display device further includes a main flexible printed circuit board disposed between the lens and the first substrate, and the camera module further includes a sensor flexible printed circuit board for the sensor, the main flexible printed circuit board being electrically connected to the sensor flexible printed circuit board to drive the sensor.

In an aspect, the display device further includes a main flexible printed circuit board disposed between the lens and the first substrate, and the camera module further includes a backlight unit flexible printed circuit board shared by the sensor and the backlight unit, the main flexible printed circuit board being electrically connected to the backlight unit flexible printed circuit board to drive the sensor.

In an aspect, the display device further includes an upper polarizer disposed between the cover plate and the second substrate and a lower polarizer disposed between the first substrate and the backlight unit.

In the above-described display device of the present disclosure, the first substrate may be a thin film transistor substrate, and the second substrate may be a color filter substrate.

In the present disclosure, by coating an infrared cut-off filtering film on a first substrate, such as a thin film transistor (TFT) substrate, in a single level area of the display module, and making the first substrate, such as a TFT substrate, to act as a supporting plate and an infrared cut-off filter of the camera module, the infrared cut-off filtering sheet and the middle case in the traditional camera module can be eliminated. Alternatively, the above effect can also be achieved by providing an opening in a first substrate such as a TFT substrate and embedding an infrared cut-off filtering sheet in the opening. Moreover, by applying the sensor of the camera module directly on the single level area of the display module, the flexible printed circuit board acted as traces in the traditional camera module is eliminated, thus the thickness of the camera module is obviously reduced, and the thickness of the mobile phone or tablet computer using the camera module is reduced accordingly. Also, because the space above the single level area of the display module is utilized, the screen-to-body ratio can be effectively increased.

In the present disclosure, the sensor of the camera module and the display module can share an integrated circuit (IC) for their driving, the sensor of the camera module and the display module can share a main flexible printed circuit board for their driving, and the sensor of the camera module and the backlight unit can share a backlight unit flexible printed circuit board for their driving. With the above three driving modes, the flexible printed circuit board dedicated to the sensor acted as trace connection in the traditional camera module is eliminated, and the thickness of the display device can be obviously reduced.

In the display device according to the present disclosure, the Z-direction space in the module structure is effectively utilized to reduce the overall thickness. Meanwhile, the camera module, such as the dual lens, is placed in a single level area, and thus the X-direction space is utilized to effectively increase the display ratio.

The present disclosure is particularly suitable for the field of mobile phone display with an integrated camera module, but is not limited to this field.

BRIEF DESCRIPTION OF THE DRAWINGS

Exemplary embodiments of the present disclosure will be described below with reference to the accompanying drawings.

DETAILED DESCRIPTION

Figure 1A:
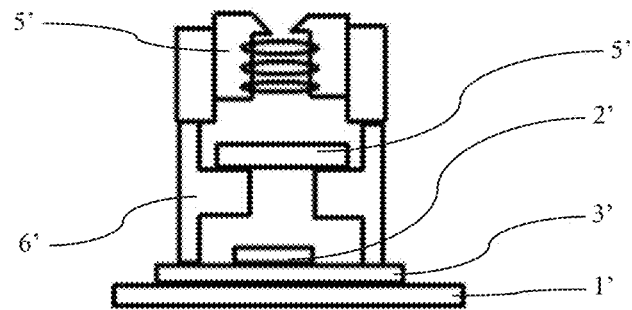
FIGS. 1A and 1B are schematic structural views of camera modules in the prior art.
Figure 1B:
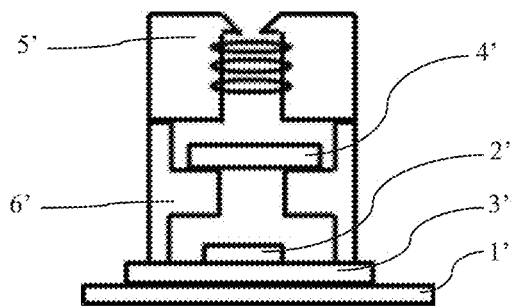

Exemplary embodiments of the present disclosure will be described in detail below. The exemplary embodiments described below and illustrated in the drawings are intended to teach the principles of the present disclosure and enable those skilled in the art to implement and use the disclosure in several different environments and for several different applications.

Figure 2:
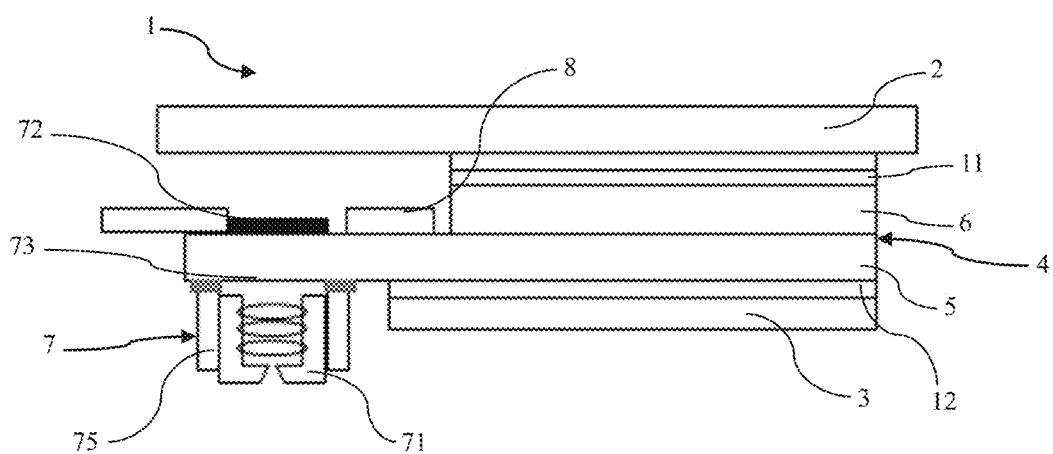
FIG. 2 shows a schematic structural view of a first embodiment of a display device according to the present disclosure.

FIG. 2 shows a schematic structural view of a first embodiment of a display device according to the present disclosure. As can be seen from the figure, the display device 1 includes a cover plate 2, a backlight unit 3, and a display module 4 disposed between the cover plate 2 and the backlight unit 3, wherein the display module 4 includes a first substrate 5 close to the light emitting side of the backlight unit and a second substrate 6 close to the cover plate, and the first substrate 5 has a first side facing the second substrate 6 and a second side facing the backlight unit 3. The display device 1 further includes a camera module 7 disposed on the first substrate 5, the camera module includes a lens 71 for collecting light, a sensor 72 capable of receiving light from the lens and forming sensing information, and a voice coil motor 75 for driving the lens 71. The display device 1 further includes an upper polarizer 11 disposed between the cover plate 2 and the second substrate 6 and a lower polarizer 12 disposed between the first substrate 5 and the backlight unit 3. In this embodiment, the first substrate 5 may be, for example, a thin film transistor (TFT) substrate, and the second substrate 6 may be, for example, a color filter (CF) substrate.

As shown in FIG. 2, the first substrate 5 extends horizontally beyond the second substrate 6 and the backlight unit 3, and the extended portion forms a mounting section for the camera module. The lens 71 is arranged inside the voice coil motor and fixed to the second side of the first substrate 5 by glue at the mounting section through the voice coil motor, and the sensor 72 is arranged on the first side of the first substrate 5 opposite to the lens. In this embodiment, an infrared cut-off filter 73 for filtering out infrared light is an infrared cut-off filtering film coated (e.g. electroplated) on the first side of the first substrate 5. The infrared cut-off filtering film may be either a reflective infrared cut-off filtering film such as a metal, metal alloy or metal compound material film, or an absorptive infrared cut-off filtering film such as a blue glass film. Alternatively, the infrared cut-off filtering film may be coated on the second side of the first substrate 5, or on both sides of the first substrate 5.

Figure 3:
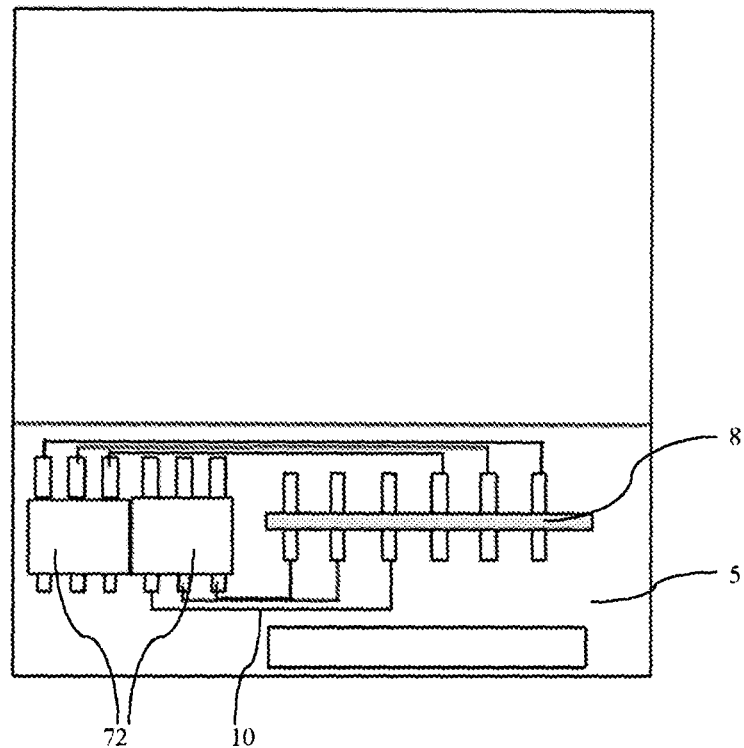
FIG. 3 is a schematic view showing that the camera module and the display module in FIG. 2 share an integrated circuit for their driving.

As shown in FIG. 3, the display device 1 includes an integrated circuit 8 disposed on the first side of the first substrate 5, which is electrically connected to the sensor 72 through an indium tin oxide trace 10 to drive the sensor. In this embodiment, the camera module 7 is, for example, a dual rear camera, so two sensors 72 are shown. It should be understood by those skilled in the art that the indium tin oxide trace can also be replaced by any other suitable material, which is also included in the scope of the present disclosure.

In the above embodiment, an infrared cut-off filtering film is used to replace the infrared cut-off filtering sheet in the existing camera module, and the display module 4 and the sensor 72 of the camera module 7 share the integrated circuit 8, so that the flexible printed circuit board dedicated to the sensor and acted as trace connection in the traditional camera module is eliminated, thereby reducing the thickness of the display module and the camera module.

Figure 4:
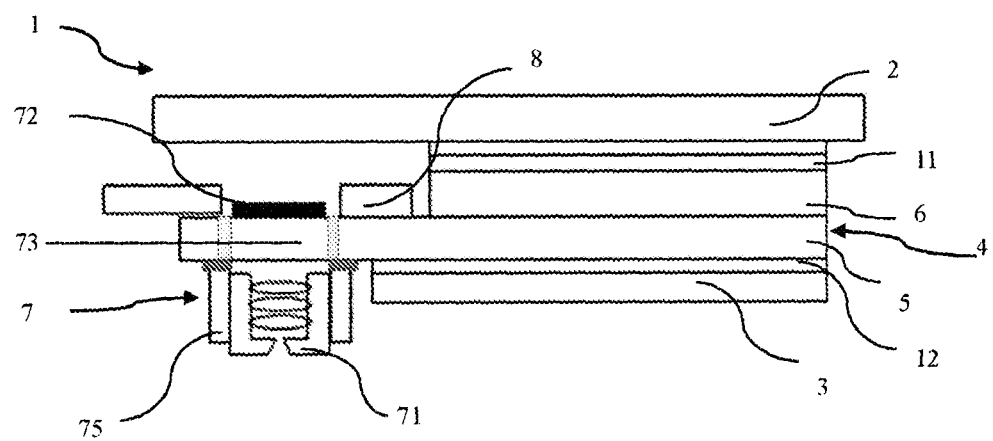
FIG. 4 shows a schematic structural view of a second embodiment of the display device according to the present disclosure.

FIG. 4 shows a schematic structural view of a second embodiment of the display device according to the present disclosure. A first substrate 5 extends horizontally beyond a second substrate and a backlight unit 3, and the extended portion forms a mounting section for the camera module. As can be seen from the figure, this embodiment differs from the first embodiment only in that the mounting section of the first substrate 5 is provided with an opening in which an infrared cut-off filtering sheet is embedded, the infrared cut-off filtering sheet replaces the infrared cut-off filtering film coated on the first substrate 5 in the first embodiment. For example, the infrared cut-off filtering sheet can be adhered to the wall of the opening by double-sided adhesive glue. A lens 71 is arranged inside a voice coil motor and fixed to the second side of the first substrate 5 by glue at the mounting section through the voice coil motor, and a sensor 72 is arranged on the infrared cut-off filtering sheet opposite to the lens.

Figure 5:
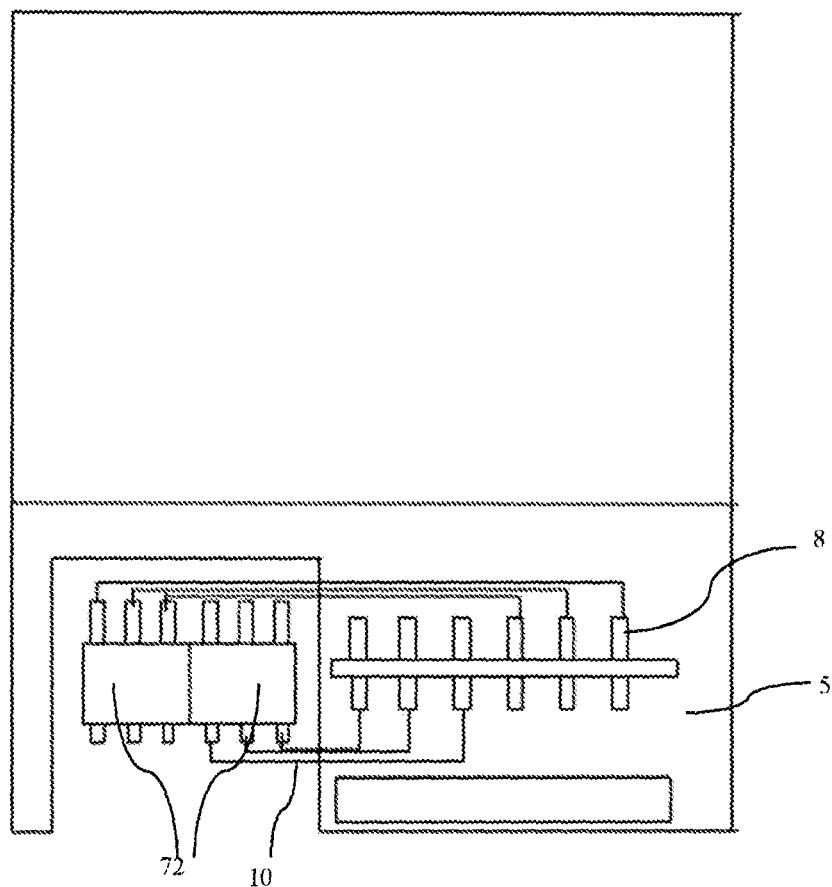
FIG. 5 is a schematic view showing that the camera module and the display module in FIG. 4 share an integrated circuit for their driving.

As shown in FIG. 5, as in the first embodiment, the display device 1 includes an integrated circuit 8 disposed on the first side of the first substrate 5, which is electrically connected to the sensor 72 through, for example, an indium tin oxide trace 10 to drive the sensor. In this embodiment, the camera module 7 is, for example, a dual rear camera, so two sensors 72 are shown.

In this embodiment, the infrared cut-off filtering sheet is embedded in the first substrate, and the display module 4 and the sensor 72 of the camera module 7 share the integrated circuit 8, so that the flexible printed circuit board dedicated to the sensor for wiring connection in the traditional camera module is eliminated, thereby reducing the thickness of the display module.

Figure 6:
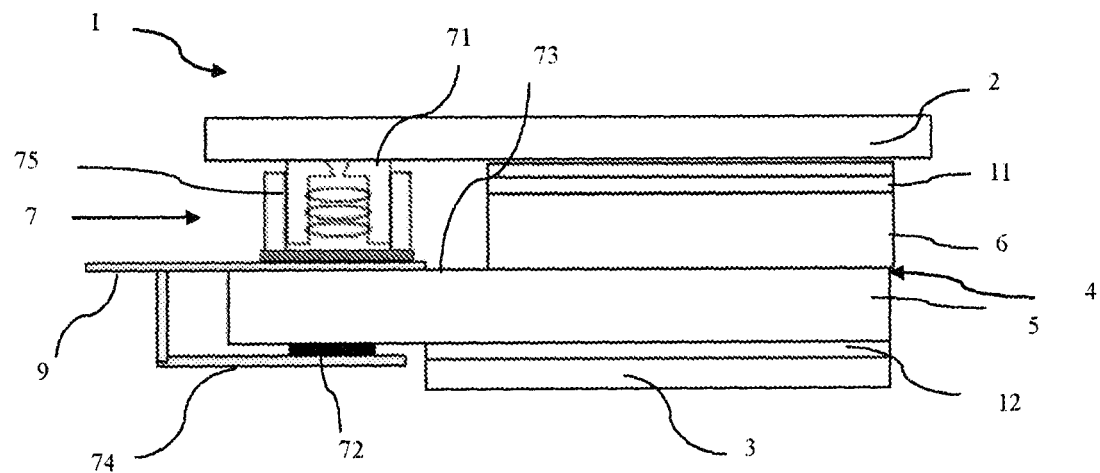
FIG. 6 shows a schematic structural view of a third embodiment of the display device according to the present disclosure.

FIG. 6 shows a schematic structural view of a third embodiment of the display device according to the present disclosure. A first substrate 5 extends horizontally beyond a second substrate and a backlight unit 3, and the extended part constitutes a mounting section for the camera module. This embodiment differs from the first embodiment in that a lens 71 is fixed to the first side of the first substrate 5 at the mounting section and a sensor 72 is arranged on the second side of the first substrate 5 opposite to the lens. The infrared cut-off filter 73 for filtering out infrared light may be an infrared cut-off filtering film coated (e.g. electroplated) on the second side of the first substrate 5. Alternatively, the infrared cut-off filtering film may be coated on the first side of the first substrate 5, or on both sides of the first substrate 5.

In this third embodiment, the display module includes a main flexible printed circuit board 9 disposed between the lens 71 and the first substrate 5, and the camera module 7 further includes a sensor flexible printed circuit board 74 for the sensor 72, wherein the main flexible printed circuit board 9 is electrically connected to the sensor flexible printed circuit board 74 through, for example, an indium tin oxide trace to drive the sensor.

In this embodiment, an infrared cut-off filtering film is used to replace the infrared cut-off filtering sheet in the existing camera module, and the display module 4 and the sensor 72 of the camera module 7 share the main flexible printed circuit board, so that the flexible printed circuit board dedicated to the sensor for wiring connection in the traditional camera module is eliminated, thereby reducing the thickness of the camera module and the display module, and further reducing the thickness of the display device.

Figure 7:
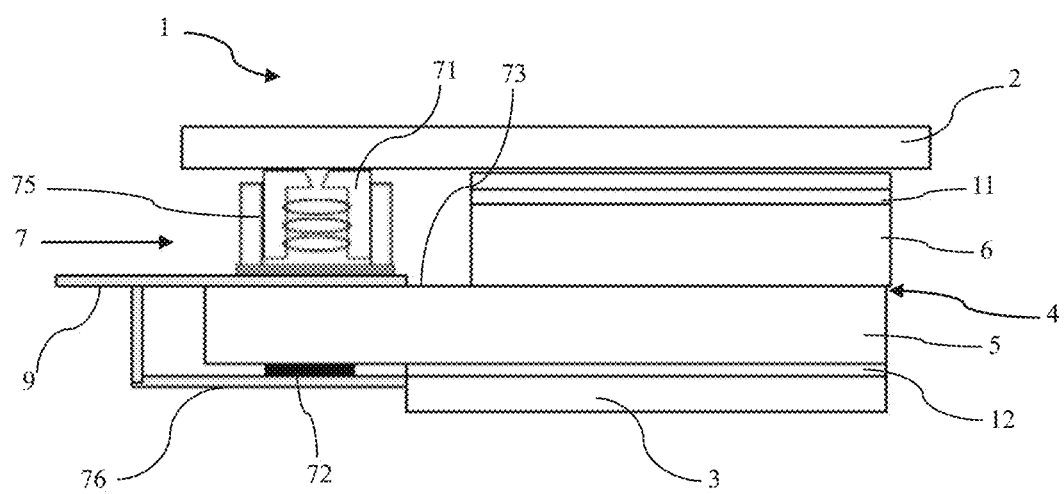
FIG. 7 shows a schematic structural view of a fourth embodiment of the display device according to the present disclosure.

FIG. 7 shows a schematic structural view of a fourth embodiment of the display device according to the present disclosure. The display device in this embodiment is similar in structure to the third embodiment shown in FIG. 6. The display device 1 includes a main flexible printed circuit board 9 disposed between a lens 71 and a first substrate 5, and the camera module 7 further includes a backlight unit flexible printed circuit board 76 shared by a sensor 72 and a backlight unit 3, wherein the main flexible printed circuit board 9 is electrically connected to the backlight unit flexible printed circuit board 76 through, for example, an indium tin oxide trace to drive the sensor 72.

In this embodiment, an infrared cut-off filtering film is used to replace the infrared cut-off filtering sheet in the existing camera module, and the backlight unit and the sensor 72 of the camera module 7 share the backlight unit flexible printed circuit board, which is connected with the main flexible printed circuit board, so that the flexible printed circuit board dedicated to the sensor and acted as trace connection in the traditional camera module is eliminated, thereby reducing the thickness of the display device.

In the present disclosure, the display device may include, but is not limited to, a mobile phone, a tablet computer, a navigation display device, or a wearable electronic device.

Unless otherwise defined, the technical terms or scientific terms used in this disclosure have the normal meaning understood by those with ordinary skills in the field to which the present disclosure belongs. As used in this disclosure, "first", "second" and similar words do not indicate any order, quantity or importance, but are only used to distinguish between different components. "Include" or "comprise" or other similar words mean that the elements or objects appearing before the words cover the listed elements or objects appearing after the words as well as their equivalents, but do not exclude other elements or objects. "Connected" or "linked" or other similar words are not limited to physical or mechanical connection, but may include electrical connection, whether direct or indirect. "Upper", "lower", "left" and "right" and etc. are only used to indicate the relative positional relationship, which may change accordingly when the absolute position of the described object changes.

It can be understood that when an element such as a layer, film, region, or substrate is said to be located "above" or "below" another element, the element may be "directly" located "above" or "below" another element, or there may be at least one intermediate element.

It should be noted that the above description is only exemplary, and those skilled in the art can make various modifications and variations to the embodiments of the present disclosure according to the above description, which are within the protection scope of the present disclosure.

What is claimed is:

1. A display device comprising:
   a cover plate;
   a backlight unit;
   a display module disposed between the backlight unit and the cover plate, the display module including a first substrate close to a light emitting side of the backlight unit and a second substrate close to the cover plate; and
   a camera module disposed on the first substrate, the camera module including an infrared cut-off filter, wherein the camera module further includes a lens for collecting light and a sensor for receiving light from the lens and forming sensing information, and wherein the infrared cut-off filter is located between the lens and the sensor,
   wherein the first substrate extends horizontally beyond the second substrate and the backlight unit to form a mounting section for the camera module, wherein the infrared cut-off filter is disposed in the mounting section, wherein the mounting section is provided with an opening, wherein the infrared cut-off filter is configured as an infrared cut-off filtering sheet embedded in the opening, wherein the lens is disposed on the first substrate at the mounting section, and wherein the sensor is disposed on the infrared cut-off filtering sheet.

2. The display device according to claim 1, wherein the display device includes an integrated circuit disposed on the first side of the first substrate, and wherein the integrated circuit is electrically connected to the sensor through a trace to drive the sensor.

3. The display device according to claim 1, wherein the display device further includes an upper polarizer disposed between the cover plate and the second substrate and a lower polarizer disposed between the first substrate and the backlight unit.

4. The display device according to claim 1, wherein the first substrate is a thin film transistor substrate and wherein the second substrate is a color filter substrate.

5. A display device comprising:
a cover plate;
a backlight unit;
a display module disposed between the backlight unit and the cover plate, the display module including a first substrate close to a light emitting side of the backlight unit and a second substrate close to the cover plate; and
a camera module disposed on the first substrate, the camera module including an infrared cut-off filter, wherein the camera module further includes a lens for collecting light and a sensor for receiving light from the lens and forming sensing information, and wherein the infrared cut-off filter is located between the lens and the sensor,
wherein the first substrate extends horizontally beyond the second substrate and the backlight unit to form a mounting section for the camera module, and wherein the infrared cut-off filter is disposed in the mounting section, wherein the infrared cut-off filter is configured as an infrared cut-off filtering film coated on the first substrate at the mounting section.

6. The display device according to claim 5, wherein the first substrate includes a first side facing the cover plate and an opposite second side facing the backlight unit, and wherein the infrared cut-off filtering film is coated on the second side and/or the first side of the first substrate.

7. The display device according to claim 6, wherein at the mounting section, the sensor is disposed on the first side of the first substrate, and the lens is disposed on the second side of the first substrate.

8. The display device according to claim 6, wherein at the mounting section, the lens is disposed on the first side of the first substrate, and the sensor is disposed on the second side of the first substrate.

9. The display device according to claim 7, wherein the display device includes a main flexible printed circuit board disposed between the lens and the first substrate, and wherein the camera module further includes a sensor flexible printed circuit board for the sensor, the main flexible printed circuit board electrically connected to the sensor flexible printed circuit board to drive the sensor.

10. The display device according to claim 7, wherein the display device includes a main flexible printed circuit board disposed between the lens and the first substrate, and wherein the camera module further includes a backlight unit flexible printed circuit board shared by the sensor and the backlight unit, the main flexible printed circuit board electrically connected to the backlight unit flexible printed circuit board to drive the sensor.

11. The display device according to claim 5, wherein the display device includes an integrated circuit disposed on the first side of the first substrate, and wherein the integrated circuit is electrically connected to the sensor through a trace to drive the sensor.

12. The display device according to claim 6, wherein the display device includes an integrated circuit disposed on the first side of the first substrate, and wherein the integrated circuit is electrically connected to the sensor through a trace to drive the sensor.

13. The display device according to claim 7, wherein the display device includes an integrated circuit disposed on the first side of the first substrate, and wherein the integrated circuit is electrically connected to the sensor through a trace to drive the sensor.

14. The display device according to claim 8, wherein the display device includes an integrated circuit disposed on the first side of the first substrate, and wherein the integrated circuit is electrically connected to the sensor through a trace to drive the sensor.

15. The display device according to claim 8, wherein the display device includes a main flexible printed circuit board disposed between the lens and the first substrate, and wherein the camera module further includes a sensor flexible printed circuit board for the sensor, the main flexible printed circuit board electrically connected to the sensor flexible printed circuit board to drive the sensor.

16. The display device according to claim 8, wherein the display device includes a main flexible printed circuit board disposed between the lens and the first substrate, and wherein the camera module further includes a backlight unit flexible printed circuit board shared by the sensor and the backlight unit, the main flexible printed circuit board electrically connected to the backlight unit flexible printed circuit board to drive the sensor.

* * * * *